(12) United States Patent
Tran et al.

(10) Patent No.: US 12,388,427 B2
(45) Date of Patent: Aug. 12, 2025

(54) RETENTION FLIP-FLOP WITH MULTIPLE POSITIVE SUPPLY VOLTAGE DOMAINS

(71) Applicant: GlobalFoundries U.S. Inc., Malta, NY (US)

(72) Inventors: Dzung T. Tran, Austin, TX (US); Navneet K. Jain, Milpitas, CA (US); Uttam Saha, San Jose, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 192 days.

(21) Appl. No.: 18/459,522

(22) Filed: Sep. 1, 2023

(65) Prior Publication Data

US 2025/0080091 A1    Mar. 6, 2025

(51) Int. Cl.
  *H03K 3/037*    (2006.01)

(52) U.S. Cl.
  CPC .................................. *H03K 3/0375* (2013.01)

(58) Field of Classification Search
  CPC .................................................... H03K 3/0375
  See application file for complete search history.

(56) References Cited

U.S. PATENT DOCUMENTS

| | | | |
|---|---|---|---|
| 11,456,728 | B2 | 9/2022 | Huang et al. |
| 11,984,893 | B2 * | 5/2024 | Huang ................ H03K 3/0372 |
| 2022/0094340 | A1 | 3/2022 | Venugopal et al. |
| 2023/0017888 | A1 * | 1/2023 | Kong ............... H03K 19/17772 |

OTHER PUBLICATIONS

Henzler et al., "Dynamic State-Retention Flip-Flop for Fine-Grained Power Gating With Small Design and Power Overhead," IEEE Journal of Solid-State Circuits, vol. 41, No. 7, Jul. 2006, 8 pages.

* cited by examiner

*Primary Examiner* — Patrick O Neill
(74) *Attorney, Agent, or Firm* — David Cain; Hoffman Warnick LLC

(57) ABSTRACT

A disclosed flip-flop includes primary and secondary sections connected to switchable and continuous power supplies, respectively. The primary section includes logic outputting first control signals, a primary latch controlled by the first control signals, and a data output device connected to an output terminal of the primary latch. The secondary section includes logic outputting second control signals and a secondary latch. A first transmission gate controlled by the second control signals is connected between the output terminal of the primary latch and an input terminal of the secondary latch. A second transmission gate controlled by the first and second control signals is connected between output and input terminals of the secondary latch. In a normal mode, both sections receive power and the first transmission gate is conductive. In a retention mode, the primary section is powered down, the first transmission gate is non-conductive and the second transmission gate is conductive.

20 Claims, 15 Drawing Sheets

RETENTION FLIP-FLOP WITH MULTIPLE POSITIVE SUPPLY VOLTAGE DOMAINS

BACKGROUND

The present disclosure relates to flip-flop circuits and, more particularly, to embodiments of a retention flip-flop circuit with multiple positive supply voltage (VDD) domains.

A retention flip-flop is a clock-controlled circuit including multiple latches (e.g., at least a primary latch and a secondary latch). Retention flip-flops are typically configured to operate in two modes: a first mode (also referred to herein as a normal mode or, alternatively, an operational mode) and a second mode (also referred to herein as a retention mode or, alternatively, a standby mode, or sleep mode). During the normal mode, all latches within the retention flip-flop are powered on. As a data in signal (D) is received at an input terminal, it is temporarily stored and a corresponding data out signal (Q) is output from an output terminal as a function of the state of a clock signal (and inverted version thereof). When the retention flip-flop switches from the normal mode to the retention mode, the last data value received is captured by the secondary latch. The primary latch is powered down to conserve power, while the secondary latch remains powered on in order to retain the captured data value. When the retention flip-flop switches from the retention mode back to the normal mode, the primary latch is powered back on and the captured data value will, as a function of the clock signal (and inverted version thereof), be transmitted to the output terminal. Unfortunately, while currently available retention flip-flops can exhibit reduced power consumption during the retention mode, the power consumption may still be significant and there is often a trade-off with operating speed during the normal mode.

SUMMARY

Disclosed herein are embodiments of a circuit and, particularly, of a retention flip-flop. The circuit can include a switchable power supply and a primary section connected to the switchable power supply. The primary section can include a primary latch, which has first input and output terminals, and data output device connected to the first output terminal. The circuit can further include a continuous power supply and a secondary section connected to the continuous power supply. The secondary section can include a secondary latch, which has second input and output terminals. The circuit can further include a first transmission gate connected between the first output terminal of the primary latch and the second input terminal of the secondary latch and a second transmission gate connected between the second output and input terminals of the secondary latch. The various components of the circuit (i.e., the primary section, the secondary section, the first transmission gate, and the second transmission gate) can include multiple field effect transistors. Optionally, of the multiple field effect transistors, transistors within the primary section, the first transmission gate, and the second transmission gate can have shorter channel lengths than transistors within the secondary section.

Some embodiments of a circuit disclosed herein can include a switchable power supply and a primary section connected to the switchable power supply. The primary section can include a primary latch having a first input and output terminals and a data output device connected to the first output terminal. The circuit can further include a continuous power supply and a secondary section connected to the continuous power supply. The secondary section can include a secondary latch having a second input and output terminals. The circuit can further include a first transmission gate connected between the first output terminal of the primary latch and the second input terminal of the secondary latch and a second transmission gate connected between the second output and input terminals of the secondary latch. The various components of the circuit (i.e., the primary section, the secondary section, the first transmission gate, and the second transmission gate) can include multiple field effect transistors. Of the multiple field effect transistors, transistors within the primary section, the first transmission gate, and the second transmission gate can have lower threshold voltages than transistors within the secondary section.

Some embodiments of a circuit disclosed herein can include a switchable power supply and a primary section connected to the switchable power supply. The primary section can include a primary latch having a first input and output terminals and a data output device connected to the first output terminal. The circuit can further include a continuous power supply and a secondary section connected to the continuous power supply. The secondary section can include a secondary latch having a second input and output terminals. The circuit can further include a first transmission gate connected between the first output terminal of the primary latch and the second input terminal of the secondary latch and a second transmission gate connected between the second output and input terminals of the secondary latch. The various components of the circuit (i.e., the primary section, the secondary section, the first transmission gate, and the second transmission gate) can include multiple field effect transistors. Of the multiple field effect transistors, transistors within the primary section, the first transmission gate, and the second transmission gate can have lower threshold voltages and shorter channel lengths than transistors within the secondary section.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which.

DETAILED DESCRIPTION

Figure 1:
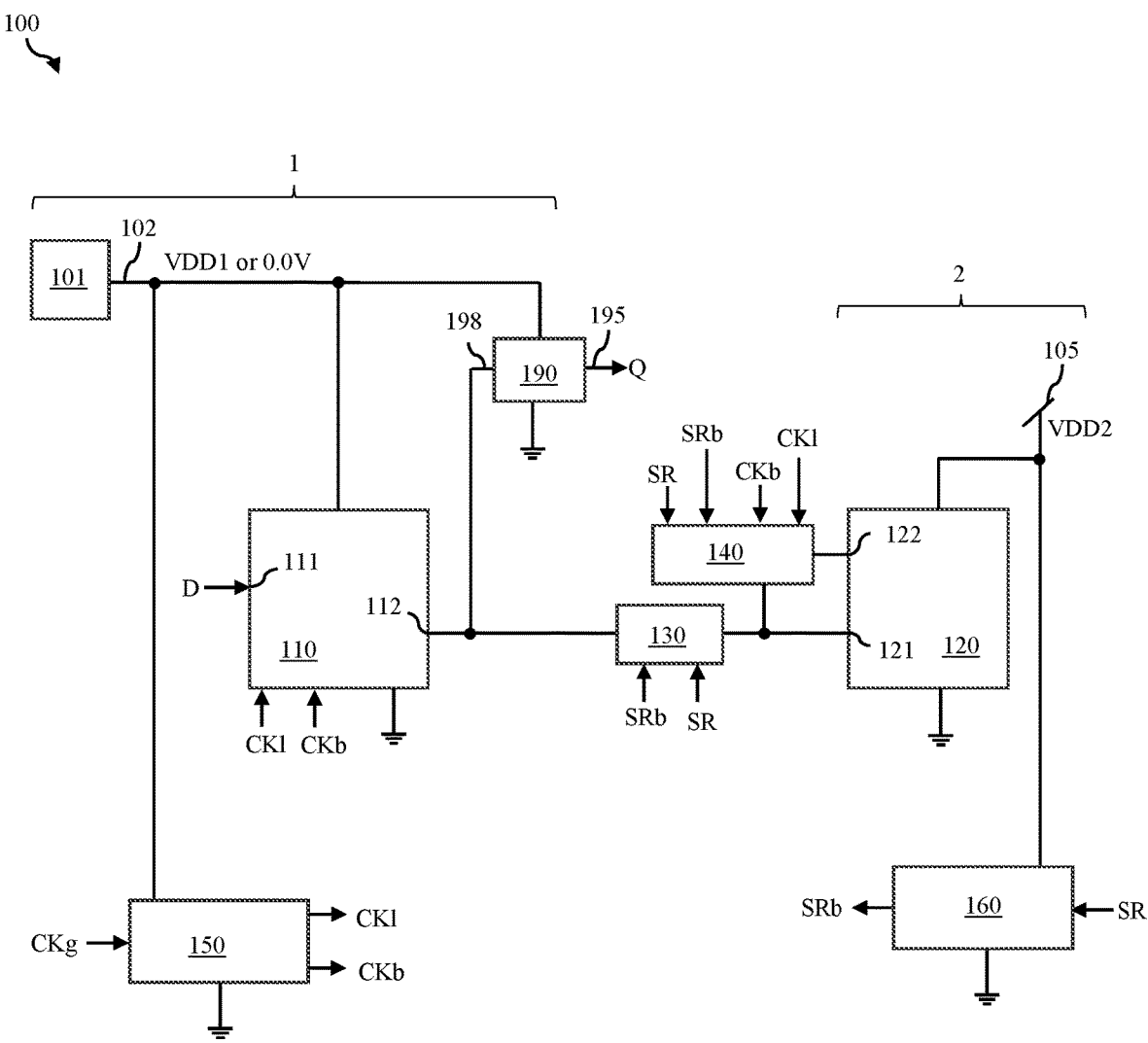
FIG. 1 shows a schematic diagram illustrating disclosed embodiments of retention flip-flop.

As mentioned above, with currently available retention flip-flops, power consumption during the retention mode may still be significant and there is often a trade-off with operating speed during the normal mode.

In view of the foregoing, disclosed herein are embodiments of a low leakage, high-speed, retention flip-flop with multiple positive supply voltage domains. The disclosed circuit can include: a primary section connected to a switchable power supply and a secondary section connected to a continuous power supply. The primary section can include: a first logic block for generating inverted and local clock signals (referred to herein as first control signals) from a global clock signal; a primary latch that is controlled by the first control signals and that includes an input terminal for receiving a data input signal (D) and an output termina; and a data output device that is connected to the output terminal of the primary latch and that outputs a data output signal (Q). The secondary section can include a second logic block for generating an inverted set/reset signal from a set/reset signal (both of which are referred to herein as second control signals) and a secondary latch. The disclosed circuit can further include two transmission gates. Specifically, a first transmission gate can be connected between the output terminal of the primary latch and the input terminal of the secondary latch and can be controlled by the second control signals. A second transmission gate can be connected between the output and terminals of the secondary latch and can be controlled by both the first and second control signals. In a first mode (also referred to herein as a normal mode or, alternatively, an operational mode), the switchable power supply powers the primary section and the continuous power supply powers the secondary section. Additionally, in the normal mode, the first and second control signals cause at least the first transmission gate to be conductive. In a second mode (also referred to herein as a retention mode or, alternatively, a standby mode or a sleep mode), the primary section is powered down (e.g., the switchable power supply supplies 0.0 volts to the primary section), while the secondary section remains powered up. Additionally, in the retention mode, the first and second control signals ensure that the first transmission gate is non-conductive and the second transmission gate is conductive so that the most recently received data signal is captured and retained in the secondary latch. The disclosed retention flip-flop circuit improves operating speed relative to conventional retention flip-flop circuits because the data output device is connected to the output terminal of the primary latch (i.e., Q is not output from the secondary latch). Optionally, in some embodiments, the retention flip-flop can include transistors with shorter channel lengths and/or lower threshold voltages within the primary section and transmission gates and transistors with longer channel lengths and/or higher threshold voltages within the secondary section in order to both improve operating speed in the normal mode and reduced power consumption in the retention mode. Also, optionally, in some embodiments, the retention flip-flop can be implemented in a fully-depleted semiconductor-on-insulator (e.g., a fully-depleted silicon-on-insulator (FDSOI)) technology processing platform.

Referring to FIG. 1, disclosed herein are embodiments of a circuit and, particularly, a retention flip-flop 100 (also referred to herein as a flip-flop 100). Flip-flop 100 can include a primary section 1 (also referred to herein as the first voltage domain section), a secondary section 2 (also referred to herein as the second voltage domain, and a pair of transmission gates (including a first transmission gate 130 and a second transmission gate 140) connected between the primary section 1 and the secondary section 2.

Primary section 1 and secondary section 2 can operate in different voltage domains. Specifically, primary section 1 can be electrically connected to an output 102 of a first power supply and, particularly, to a switchable power supply 101. Switchable power supply 101 can be configured to provide a first power supply voltage at output 102 and this first power supply voltage can be switchable (e.g., in response to signals from a system controller (not shown)) between a first positive voltage level (VDD1) during a first mode of operation (also referred to herein as a normal mode or, alternatively, an operational mode) in the flip-flop 100 and zero volts (0.0V) during a second mode of operation (also referred to herein as a retention mode or, alternatively, a standby mode or a sleep mode). Such switchable power supplies are well known in the art and, thus, the details thereof have been omitted from this specification in order to allow the reader to focus on the salient aspects of the disclosed embodiments, as discussed in greater detail below. Secondary section 2 can be electrically connected to a second power supply and, particularly, a continuous power supply 105. Continuous power supply 105 can be, for example, a positive voltage rail for a second power supply voltage at a second positive voltage level (VDD2) so that secondary section 2 is powered by VDD2 during both the normal and retention modes of operation. In some embodiments, VDD1 and VDD2 can be at the same positive voltage level (i.e., VDD1 and VDD2 can be set at equal positive voltage levels). In other embodiments VDD1 and VDD2 can be different positive voltage levels. For example, in some embodiments, VDD2 can be at a lower positive voltage level than VDD1 to further reduce power consumption in the retention mode.

Primary section 1 can include, for example, a primary latch 110. Primary latch 110 can have a first input terminal 111 (also referred to herein as a data input terminal), which is electrically connected to receive a data input signal (D) and a first output terminal 112. Primary section 1 can further include a data output device 190. Data output device 190 can have an input node 198, which is electrically connected to receive an intermediate output signal (referred to herein as a third intermediate output signal (Int3)) from first output terminal 112 of primary latch 110, and an output node 195 (also referred to herein as a data output node) for outputting a data output signal (Q).

Primary section 1 can further include a first logic block 150. First logic block 150 can be configured to generate and output multiple different clock signals (e.g., an inverted clock signal (CKb) and a local clock signal (CKl)). For purposes of this disclosure CKb and CKl are referred to as first control signals. As illustrated in FIG. 1, CKl and CKb can be used to control operation of primary latch 110 and further to control, at least in part, second transmission gate 140.

Figure 2A:
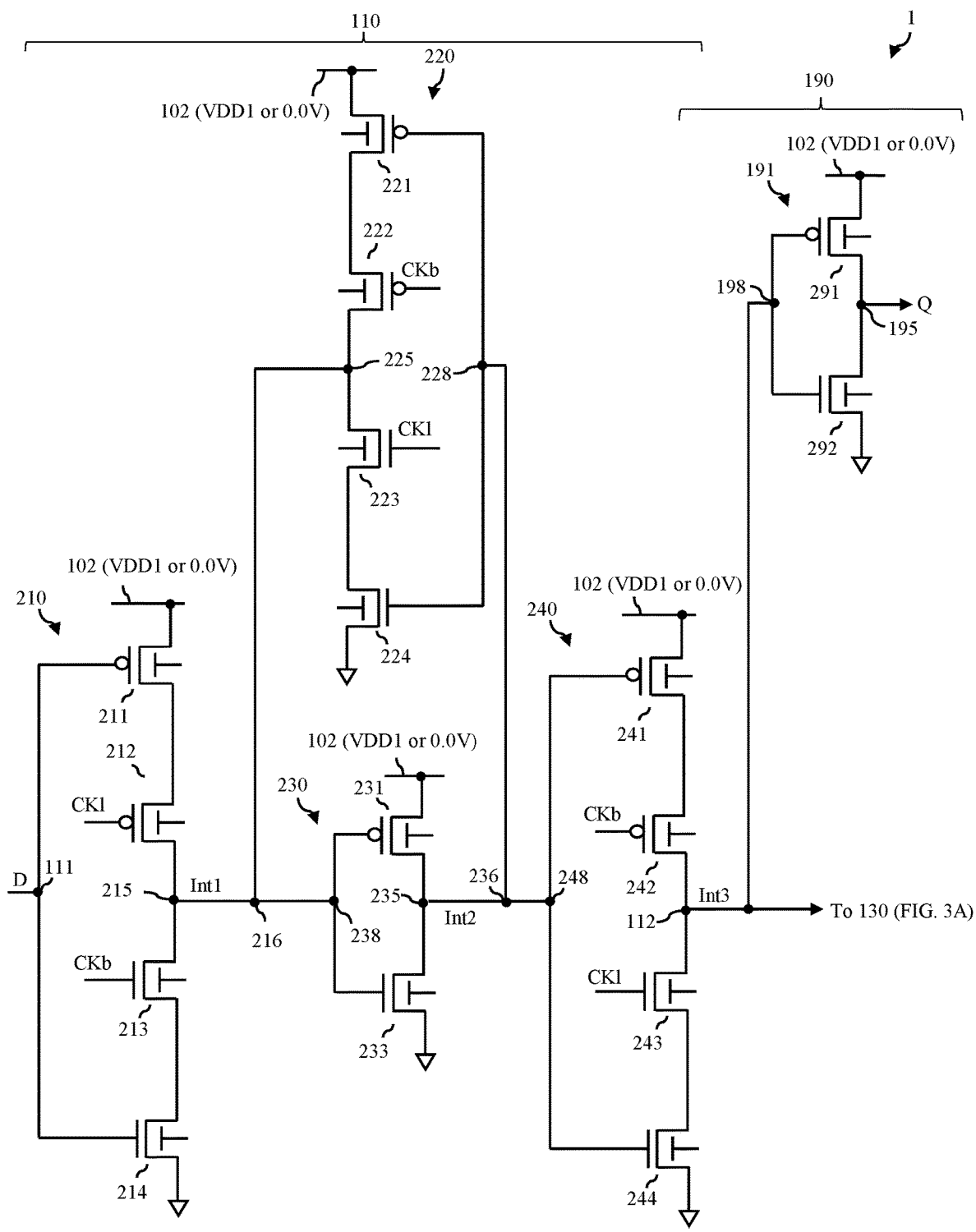
FIGS. 2A-2B show a schematic diagram illustrating an example primary section that could be incorporated into the disclosed embodiments.
Figure 2B:
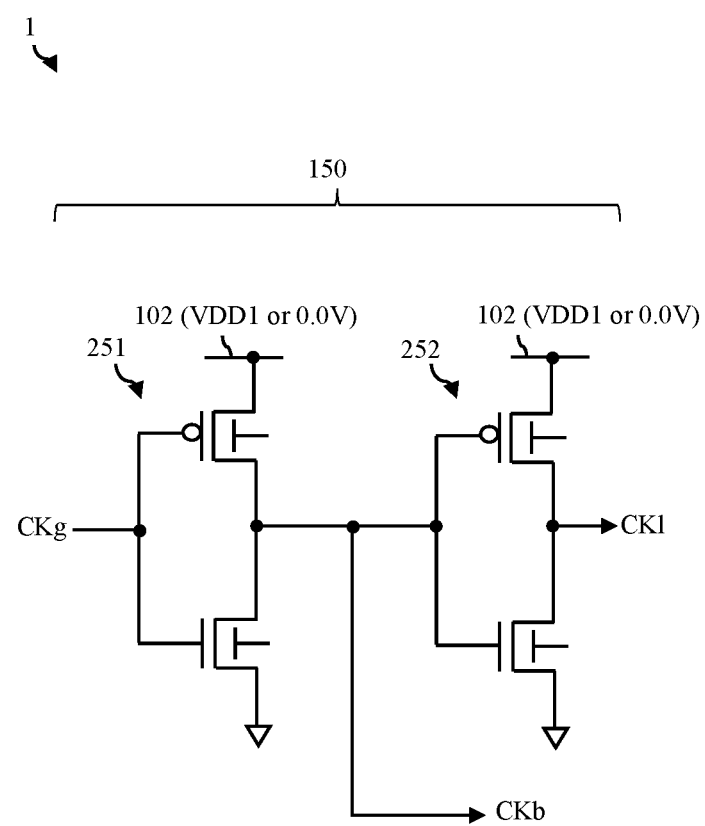

FIGS. 2A-2B show a schematic diagram illustrating an example primary section 1 (including primary latch 110, data output device 190 and first logic block 150) that is powered by switchable power supply 101 and that could be incorporated into flip-flop 100 of FIG. 1.

Referring specifically to FIG. 2A in combination with FIG. 1, primary latch 110 can include a first tri-state logic device 210, a first inverter 230, and a second tri-state logic device 240 connected in series between the first input terminal 111 and the first output terminal 112.

Specifically, first tri-state logic device 210 can include two P-channel field effect transistors (PFETs) 211-212 and two N-channel field effect transistors (NFETs) 213-214 connected in series between the output 102 of the switchable power supply 101 and ground. Gates of PFET 211 and NFET 214 can be tied to first input terminal 111 of primary latch 110 to receive data input signal (D). Additionally, gates of PFET 212 and NFET 213 can be electrically connected to receive CKl and CKb, respectively, from first logic block 150. First tri-state logic device 210 can further include an output node 215 at the electrical connection between PFET 212 and NFET 213. Thus, during the normal mode (when VDD1 is at the output 102 powering on the primary section 1), the state of a first intermediate output signal (Int1) at output node 215 depends upon the states of D, CKl, and CKb.

First inverter 230 can include a PFET 231 and an NFET 233 connected in series between output 102 of switchable power supply 101 and ground. First inverter 230 can further include an input node 238 electrically connected to output node 215 of first tri-state logic device 210 for receiving Int1. First inverter 230 can further have an output node 235 at the electrical connection between PFET 231 and NFET 233 and, during the normal mode (when primary section 1 is powered on and VDD1 is at output 102), can output a second intermediate signal (Int2) at output node 235 with Int2 being inverted with respect to Int1.

Second tri-state logic device 240 can include two PFETs 241-242 and two NFETs 243-244 connected in series between output 102 of the switchable power supply 101 and ground. Gates of PFET 241 and NFET 244 can be tied to an input node 248 and, thereby to output node 235 of first inverter 230 for receiving Int2. Gates of PFET 242 and NFET 243 can be electrically connected to receive CKb and CKl, respectively, from first logic block 150. Second tri-state logic device 240 can further include first output terminal 112 of the primary latch 110 at the electrical connection between PFET 242 and NFET 243 and, during the normal mode (when primary section 1 is powered on and VDD1 is at output 102), the state of Int3 at first output terminal 112 of primary latch 110 will be dependent upon the states of Int2 at input node 248, CKl, and CKb.

Primary latch 110 can further include a feedback tri-state logic device 220. Feedback tri-state logic device 220 can include two PFETs 221-222 and two NFETs 223-224 connected in series between output 102 of switchable power supply 101 and ground. Gates of PFET 221 and NFET 224 can be tied to an input node 228 and thereby to an intermediate node 236 on the signal path between first inverter 230 and second tri-state logic device 240. Gates of PFET 222 and NFET 223 can be electrically connected to receive CKb and CKl, respectively, from first logic block 150. Feedback tri-state logic device 220 can further include an output node 225 at the electrical connection between PFET 222 and NFET 223 and this output node 225 can be electrically connected to an intermediate node 216 on a signal path between first tri-state logic device 210 and first inverter 230. In other words, the feedback tri-state logic device 220 is connected between intermediate nodes 236 and 216 on the signal paths to and from the first inverter 230.

The above-described primary latch 110 is provided for illustration purposes. It should be understood that, alternatively, any other suitable primary latch configuration could be employed.

Given the above-described configuration for the primary latch 110, the data output device 190 can be a data output inverter 191. This data output inverter 191 can include a PFET 291 and an NFET 292 connected in series between output 102 of switchable power supply 101 and ground. Gates of PFET 291 and NFET 292 can be connected to the input node 198 and thereby to first output terminal 112 of the primary latch 110 for receiving Int3. Data output node 195 can be at the electrical connection between the PFET 291 and NFET 292 and, during the normal mode (when primary section 1 is powered on and VDD1 is at output 102), the state of Q will be inverted with respect to the state of Int3.

Referring specifically to FIG. 2B in combination with FIG. 1, first logic block 150 can include a pair of series-connected inverters 251 and 252. Each inverter 251 and 252 can include a PFET and an NFET connected in series between output 102 of switchable power supply 101 and ground. Gates of the PFET and NFET in inverter 251 can be tied to an input node, which is electrically connected to receive a global clock signal (CKg) (e.g., from a system controller (not shown)). Inverter 251 can further have an output node at the electrical connection between the PFET and NFET therein and, during the normal mode, inverter 251 can output an inverted clock signal (CKb) at an output node. Gates of the PFET and NFET of the inverter 252 can be tied to the output node of the inverter 251 for receiving CKb. Inverter 252 can further include an output node at the electrical connection between the PFET and NFET therein and, during the normal mode, inverter 252 can output a local clock signal (CKl) that is inverted with respect to CKb at that output node.

Referring again to FIG. 1, as mentioned above, flip-flop 100 can also include secondary section 2 and a pair of transmission gates (including a first transmission gate 130 and a second transmission gate 140) between the primary and secondary sections 1 and 2. Secondary section 2 can be electrically connected to and powered by continuous power supply 105. Secondary section 2 can include, for example, a secondary latch 120 (also referred to herein as a retention latch). Secondary latch 120 can have a second input terminal 121 and a second output terminal 122. First transmission gate 130 can be electrically connected between first output terminal 112 of primary latch 110 and second input terminal 121 of secondary latch 120. Second transmission gate 140 can be electrically connected between second output terminal 122 and second input terminal 121 of the secondary latch 120. Secondary section 2 can also include a second logic block 160, which is electrically connected to receive a set/reset signal (SR) (e.g., from a system controller (not shown)) and which is configured to output an inverted set/reset signal (SRb). For purposes of this disclosure, SR and SRb are referred to as second control signals. As illustrated in FIG. 1, the second control signals (i.e., SR and SRb) can control operation of first transmission gate 130, and the first control signals and the second control signals (CKl, CKb, SR, and SRb) can control operation of second transmission gate 140.

Figure 3A:
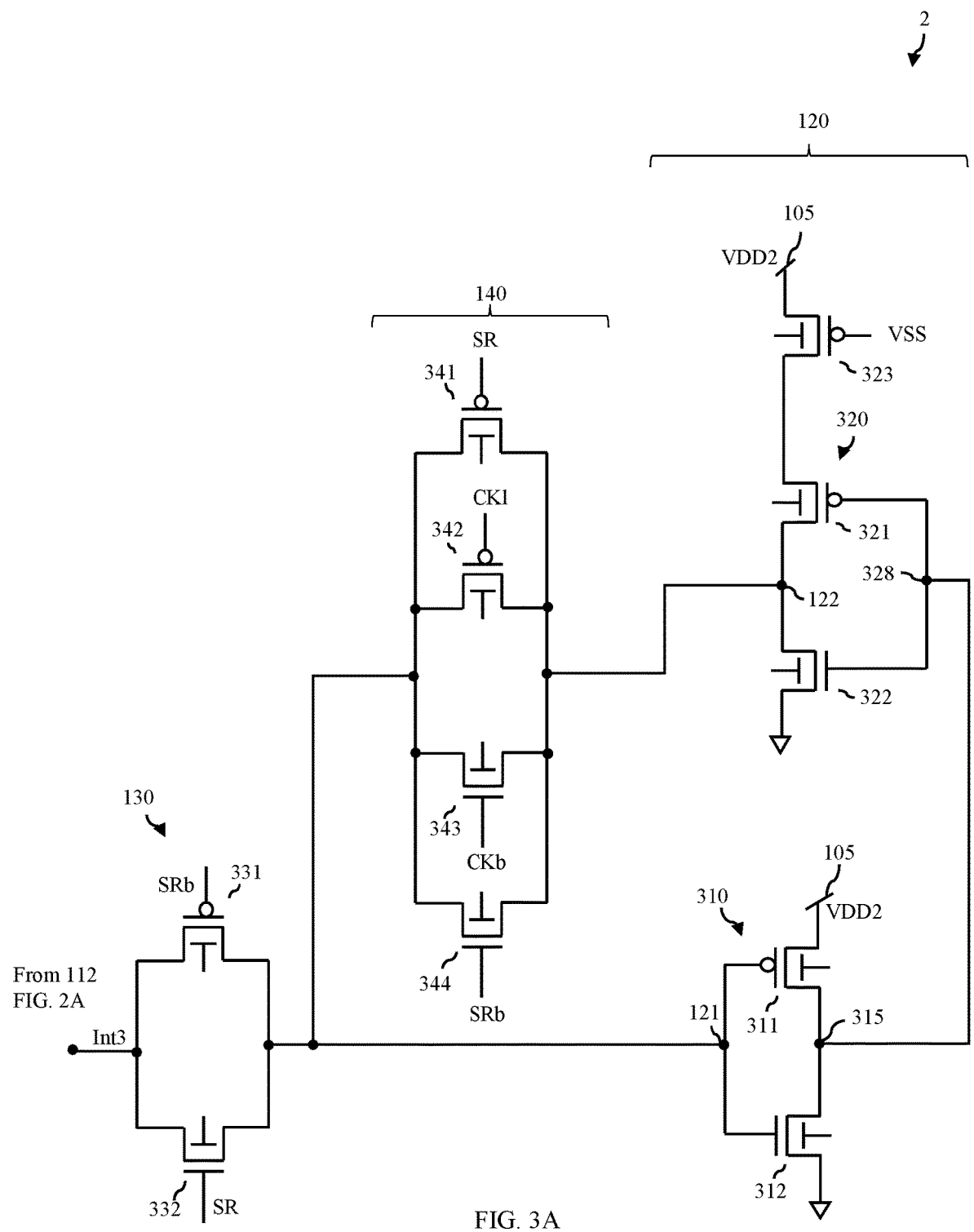
FIGS. 3A-3B show a schematic diagram illustrating an example secondary section, an example first transmission gate, and an example second transmission gate that could be incorporated into the disclosed embodiments.
Figure 3B:
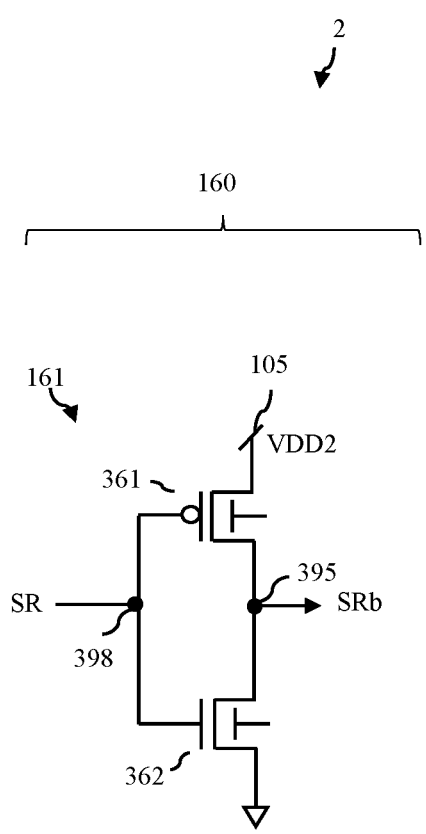

FIGS. 3A-3B show a schematic diagram illustrating an example secondary section 2 (including the secondary latch 120 and the second logic block 160) that is powered by the continuous power supply 105, an example first transmission gate 130, and an example second transmission gate 140, each of which can be incorporated into flip-flop 100 of FIG. 1.

Referring specifically to FIG. 3A in combination with FIG. 1, first transmission gate 130 can include a PFET 331 and an NFET 332 connected in parallel between first output terminal 112 of primary latch 110 and second input terminal 121 of the secondary latch 120. Gates of PFET 331 and NFET 332 can be electrically connected to receive SRb and SR, respectively. Thus, when SR is high and SRb is low (e.g., during the normal mode), first transmission gate 130 will be conductive, transmitting Int3 to second input terminal 121 of secondary latch 120. However, when SR is low and SRb is high (e.g., during the retention mode), first transmission gate 130 will be non-conductive, blocking further transmission of Int3 to the secondary latch 120.

Second transmission gate 140 can include two PFETs 341-342 and two NFETs 343-344 connected in parallel between second output terminal 122 of secondary latch 120 and second input terminal 121 of secondary latch 120. Gates of PFET 341 and NFET 344 can be electrically connected to receive SR and SRb, respectively, while gates of PFET 342 and NFET 343 can be electrically connected to receive CKl and CKb, respectively. Thus, when SR is high and SRb is low (e.g., during the normal mode), first transmission gate 130 will be conductive (as mentioned above) and second transmission gate 140 will only be conductive if/when CKl is low and CKb is high otherwise it will be non-conductive. In other words, during the normal mode, the second transmission gate 140 may be periodically conductive as a function of the CKl and CKb. However, when SR is low and SRb is high (e.g., during the retention mode), first transmission gate 130 will be non-conductive (as mentioned above) and second transmission gate 140 will be conductive regardless of the states of CKl and CKb (as the first logic block 150 that generates these signals will be powered down).

The secondary latch 120 can further include a pair of inverters (referred to herein as a second inverter 310 and a third inverter 320). Second inverter 310 can include a PFET 311 and an NFET 312 connected in series between the continuous power supply 105 and ground. Gates of PFET 311 and NFET 312 can be tied to second input terminal 121 of the secondary latch 120. Second inverter 310 can further have an output node 315 at the electrical connection between PFET 311 and NFET 312. Third inverter 320 can include a PFET 321 and an NFET 322 connected in series to ground. Third inverter 320 can have an input node 328, which is electrically connected to the output node 315 of the second inverter 310 and which is tied to the gates of PFET 321 and NFET 322. Third inverter 320 can have an output node (which is the second output terminal 122) at the electrical connection between PFET 321 and NFET 322. Optionally, PFET 321 can be tied to the continuous power supply 105 through an always-on PFET 323 (i.e., a PFET having its gate tied to ground so as to always be in a conductive state), as illustrated. This always-on PFET 323 can be employed to reduce the VDD2 current. Alternatively, the PFET 321 could be tied directly to the continuous power supply 105.

Referring specifically to FIG. 3B in combination with FIG. 1, second logic block 160 can include a single inverter. This inverter can include a PFET 361 and an NFET 362 connected in series between the fixed power supply 105 (at VDD2) and ground. Gates of the PFET 361 and NFET 362 can be tied to an input node 398, which is electrically connected to receive a set/reset signal (SR) (e.g., from a system controller (not shown)). This inverter can further include an output node 395 at the electrical connection between the PFET 361 and NFET 362 therein such that it is configured to output an inverted set/reset signal (SRb) at the output node 395.

During the normal mode (i.e., when the first transmission gate 130 is conductive and the second transmission gate 140 is non-conductive through PFET 341 and NFET 344 because SR is high and SRb is low and either conductive or not through PFET 342 and NFET 343 depending upon the states of CKl and CKb), Int3 will be supplied to second input terminal 121 of secondary latch 120 and will be twice inverted by the second and third inverters 310, 320. Thus, as Int3 output from the primary latch 120 switches states in response to D switching states, the output of third inverter 320 will similarly switch states (matching the state of Int3). During the retention mode (i.e., when the first transmission gate 130 becomes non-conductive and the second transmission gate 140 becomes conductive through PFET 341 and NFET 344 because SR is low and SRb is high), switching of Int3 will not affect the data retained in the secondary latch 120. Instead, the output of the third inverter 320 (which corresponds to the most recently received data value) is repeatedly fed back into second input terminal 121 of the secondary latch 120 maintaining the stored state of the data therein. When the flip-flop 100 switches back to the normal mode, (i.e., when the first transmission gate 130 again becomes conductive and the second transmission gate 140 becomes conductive through PFET 342 and NFET 343 (due the first logic block 150 powering up and CKl going low and CKb going high), the output of the third inverter 320 (which corresponds to the last data value received by the secondary latch during the immediately preceding normal mode and retained during the retention mode) is again fed back into second input terminal 121 of the secondary latch and also fed through the first transmission gate 130 to the data output device 190 and output as Q, maintaining the stored state of the data until such time as D received at the first input terminal of the primary latch 110 again switches states.

Figure 4A:
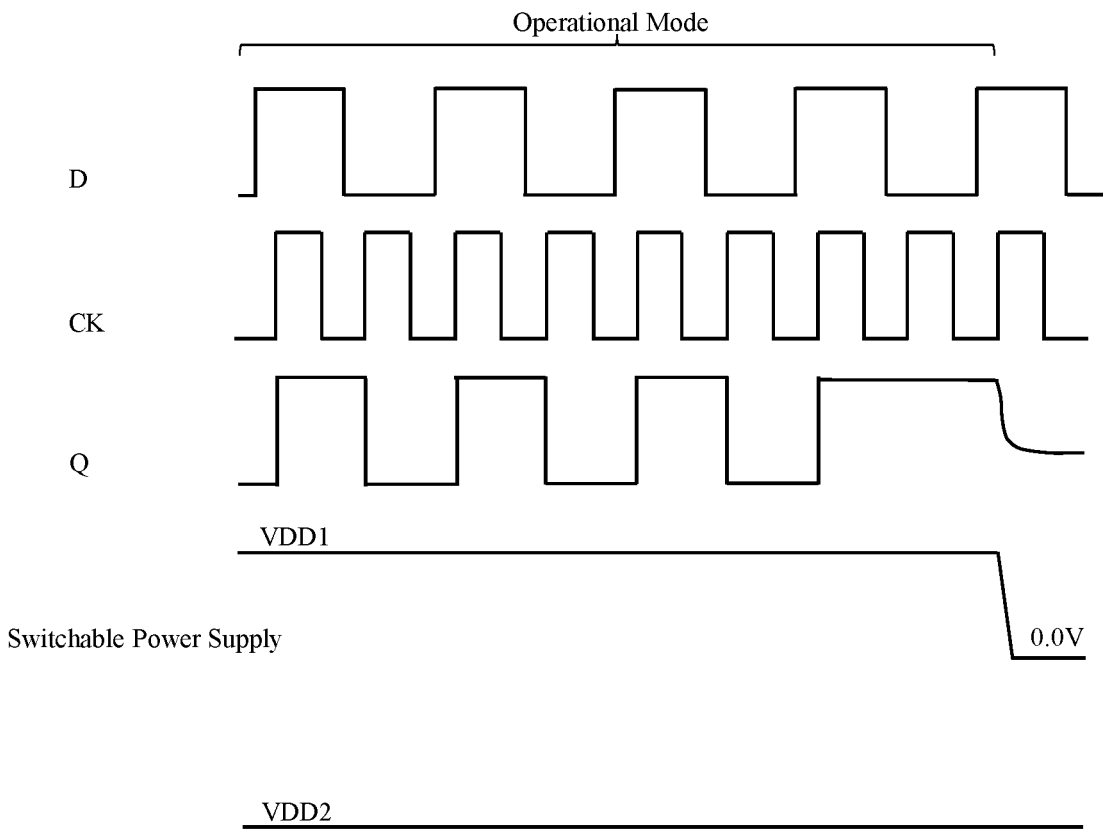
FIG. 4A shows an example of a timing diagram illustrating some of the various signals within the disclosed embodiments during a normal mode.
Figure 4A:
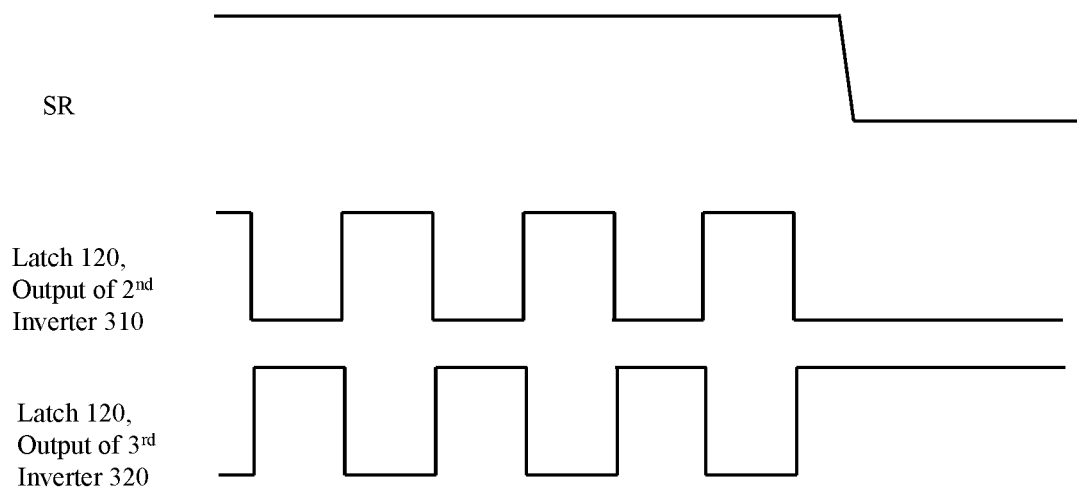
Figure 4B:
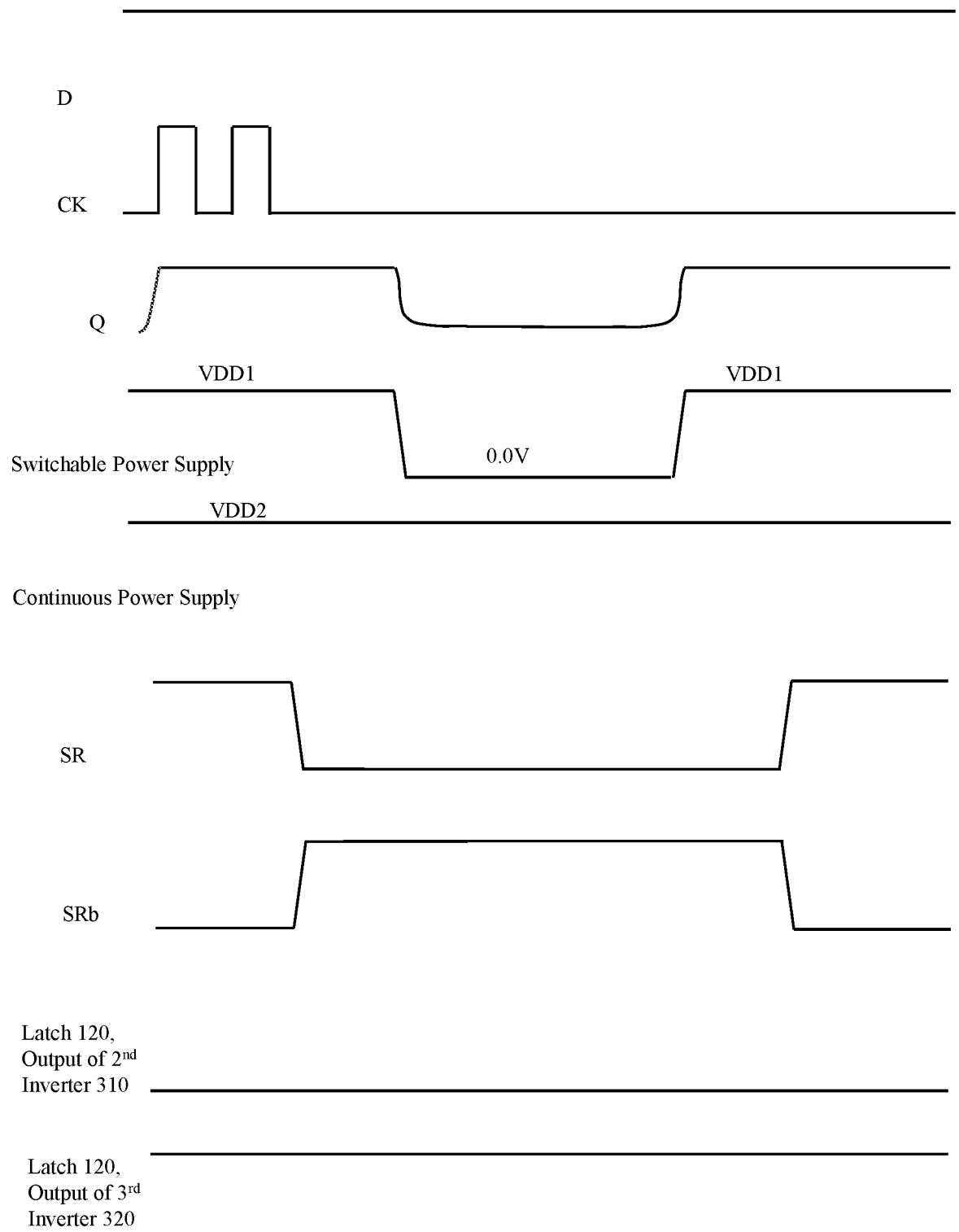
FIGS. 4B and 4C shows example timing diagram illustrating some of the various signals within the disclosed embodiments during a retention mode with a retained data value of "1" and with a retained data value "0," respectively.
Figure 4C:
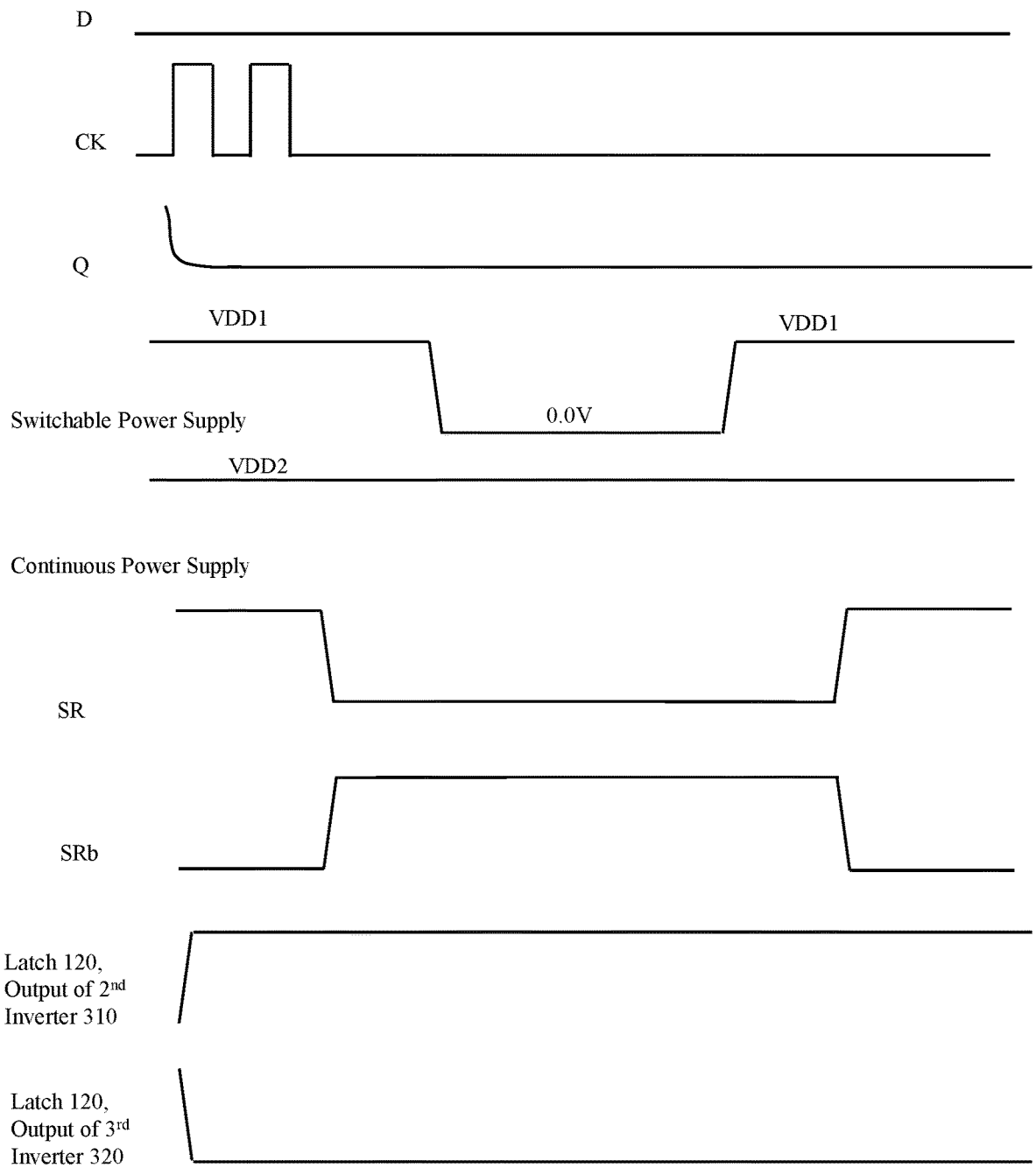

FIG. 4A is an example of a timing diagram illustrating some of the various signals within the flip-flop 100 (having a configuration as described above and illustrated in FIGS. 1, 2A-2B and 3A-3B) during normal mode operation as D switches between a logic "1" and a logic "0." As illustrated, during the normal mode, the output 102 of the switchable power supply is at VDD1. FIG. 4B is an example of a timing diagram illustrating some of the various signals within the flip-flop 100 (having a configuration as described above and illustrated in FIGS. 1, 2A-2B and 3A-3B) during a retention mode when the data captured by the secondary latch has a logic "1" value. FIG. 4C is an example of a timing diagram illustrating some of the various signals within the flip-flop 100 (having a configuration as described above and illustrated in FIGS. 1, 2A-2B and 3A-3B) during a retention mode when the data captured by the secondary latch has a logic "1" value. As illustrated, the retention mode is initiated by switching of SR from high to low (and SRb from low to high). Only after SR is switched from high to low (and SRb switched from low to high) to turn off first transmission gate 130 will the switchable power supply 101 power down the primary section 1 (i.e., change the output 102 from VDD1 to 0.0V). This delay in powering down the primary section 1 ensures capture of the most recently received data by the secondary latch 120. Furthermore, only after switching back to the normal mode where the output 102 of the switchable power supply is switched to back to VDD1 and the primary latch 110 is powered back up, will SR be switched from low to high (and SRb switched from high to low), thereby turning on first transmission gate 130 and off second transmission gate 140.

With a flip-flop configuration as described above, the data signal flows in one direction through the primary latch 110 to the first transmission gate 130. Thus, between the primary and secondary latches 110 and 120, the data signal will be glitch-free and charge sharing-free. Additionally, in some embodiments of flip-flop 100, the various transistors in the primary section 1, the secondary section 2, the first transmission gate 130 and the second transmission gate 140 can all be the same threshold voltage type (e.g., super low threshold voltage (SLVT), low threshold voltage (LVT), regular threshold voltage (RVT), high threshold voltage (HVT), etc.) and can all be the same size transistors (e.g., have the same channel length, the same channel width, etc.) for manufacturing simplicity. However, in other embodiments, threshold voltage types and/or sizes of the transistors can be varied to improve performance (e.g., increase switching speed in the normal mode) or reduce power consumption (e.g., during the retention mode).

For example, in some embodiments, all transistors within the flip-flop 100 can be essentially the same threshold voltage type (e.g., all RVT transistors), but the channel lengths of any transistors in secondary section 2 can be longer than the channel lengths of any transistors in primary section 1, first transmission gate 130, and second transmission gate 140 (e.g., see FIG. 5 discussed below). Specifically, all transistors in secondary section 2 can have relatively long channel lengths in order to reduce power consumption, whereas all transistors in primary section 1, first transmission gate 130, and second transmission gate 140 can have relatively short channel lengths to improve performance as well as reduce area consumption. Alternatively, in some embodiments, the channel lengths of all transistors in the flip-flop 100 can be the same, but the threshold voltages of any transistors in secondary section 2 can be higher than the threshold voltages of any transistors in primary section 1, first transmission gate 130, and second transmission gate 140 (e.g., see FIGS. 6A, 7A, and 8A, discussed below). Specifically, all transistors in secondary section 2 can have relatively high threshold voltages in order to reduce power consumption, whereas all transistors in primary section 1, first transmission gate 130, and second transmission gate 140 can have relatively low threshold voltages to improve performance. Alternatively, in some embodiments, the channel lengths of any transistors in secondary section 2 can be longer than the channel lengths of any transistors in primary section 1, first transmission gate 130 and second transmission gate 140 and the threshold voltages of any transistors in secondary section 2 can be higher than the threshold voltages of any transistors in primary section 1, first transmission gate 130, and second transmission gate 140 (e.g., see FIGS. 6B, 7B, and 8B, discussed below). Alternatively, first transmission gate 130 and second transmission gate 140 can also have higher threshold voltage and/or longer channel length transistors to further reduce VDD2 leakage.

Referring to FIGS. 5, 6A-6B, 7A-7B, and 8A-8B, the disclosed flip-flop 100 can be implemented as a fully depleted semiconductor-on-insulator structure (e.g., as a fully-depleted silicon-on-FDSOI structure) 500, 600A-B, 700A-B, 800A-B, respectively. Structure 500, 600A-B, 700A-B, 800A-B can include a semiconductor substrate 501, 601, 701, 801. Semiconductor substrate 501, 601, 701, 801 can be, for example, a monocrystalline silicon substrate or a substrate of any other suitable monocrystalline semiconductor material (e.g., silicon germanium, etc.). Structure 500, 600A-B, 700A-B, 800A-B can further include semiconductor-on-insulator regions (e.g., silicon-on-insulator (SOI) regions). Semiconductor-on-insulator regions can include an insulator layer 502, 602, 702, 802 on semiconductor substrate 501, 601, 701, 801. Insulator layer 502, 602, 702, 802 can be, for example, a thin silicon dioxide layer or a relatively thin layer of any other suitable insulator material. Each semiconductor-on-insulator region can further include a thin semiconductor layer 503, 603, 703, 803 on insulator layer 502, 602, 702, 802. Semiconductor layer 503, 603, 703, 803 can be, for example, a monocrystalline silicon layer or a layer of any other suitable monocrystalline semiconductor material (e.g., silicon germanium, etc.)

As discussed in greater detail above, the flip-flop 100 can include multiple field effect transistors including PFETs and NFETs in the primary section 1, in the first transmission gate 130, in the second transmission gate 140, and in the second section 1. For purposes of illustration, but to avoid clutter in the drawings, FIGS. 5, 6A-6B, 7A-7B, and 8A-8B show only two PFETs and only two NFETs. PFETs 510, 610, 710, and 810 represent any of the PFETs described above and illustrated in FIGS. 1-3B as being included in the primary section 1, first transmission gate 130, and second transmission gate 140, whereas PFETs 520, 620, 720 and 820 represent any of the PFETs described above and illustrated in FIGS. 1-3B as being included in the secondary section 2. Similarly, NFETs 540, 640, 740, and 840 represent any of the NFETs described above and illustrated in FIGS. 1-3B as being included in the primary section 1, first transmission gate 130, and second transmission gate 140, whereas NFETs 530, 630, 730 and 830 represent any of the NFETs described above and illustrated in FIGS. 1-3B as being included in the secondary section 2.

Transistors 510-540, 610-640, 710-740, and 810-840 can include an active device region in a corresponding portion of semiconductor layer 503, 603, 703, 803. The boundaries of the corresponding portions of semiconductor layer 503, 603, 703, 803 (and thereby the boundaries of the active device regions) can be defined by isolation regions 505, 605, 705, 805. Isolation regions 505, 605, 705, 805 can be, for example, shallow trench isolation (STI) regions. That is, trenches can extend from the top surface of semiconductor layer 503, 603, 703, 803 to and optionally through insulator layer 502, 602, 702, 802 can laterally surround the active device regions of the transistors, and can be filled with one or more layers of isolation materials (e.g., silicon dioxide, silicon nitride, silicon oxynitride, etc.). Each transistor 510-540, 610-640, 710-740, and 810-840 can further include, within its active device region, a channel region 511-541, 611-641, 711-741, and 811-841 between source and drain regions 512-542, 612-642, 712-742, and 812-842). In the PFETs, the source/drain regions can have P-type conductivity at a relatively high conductivity level (e.g., can be P+ source/drain regions) and the channel region can be either intrinsic (i.e., undoped) or can have N-type conductivity at a relatively low conductivity level (e.g., can be an N-channel region). In the NFETs, the source/drain regions can have N-type conductivity at a relatively high conductivity level (e.g., can be N+ source/drain regions) and the channel region can be either intrinsic (i.e., undoped) or can have P-type conductivity at a relatively low conductivity level (e.g., can be a P-channel region).

Each transistor 510-540, 610-640, 710-740, and 810-840 can further include a primary gate 514-544, 614-644, 714-

744, and 814-844 (also referred to herein as a front gate) adjacent to (e.g., above, and immediately adjacent to) the active device region at the channel region. Those skilled in the art will recognize that, in a field effect transistor (FET), a gate (also referred to as a gate structure) can include a gate dielectric layer (including one or more layers of gate dielectric material) immediately adjacent to the channel region and a gate conductor layer (including one or more layers of gate conductor material) on the gate dielectric layer. In each transistor, primary gate 514-544, 614-644, 714-744, and 814-844 can include at least a relatively thin gate dielectric layer immediately adjacent to the top surface of semiconductor layer 503, 603, 703, 803 at the channel region and a gate conductor layer on the gate dielectric layer. Primary gates 514-544, 614-644, 714-744, and 814-844 could be any of gate-first polysilicon gate structures, gate-first high-K metal gate (HKMG) structures, gate-last HKMG structures (also referred to as a replacement metal gate (RMG) structure), or any other suitable type of gate structures. Optionally, primary gates of the P-type transistors can include different gate materials than the primary gates of the N-type transistors and, thus, can have different work functions. Gate sidewall spacers can further be positioned laterally adjacent to sidewalls of primary gates 514-544, 614-644, 714-744, and 814-844 (e.g., to electrically isolate the gate structure from adjacent S/D regions). Such gate structures are well known in the art and, thus, the details thereof have been omitted from the specification in order to allow the reader to focus on the salient aspects of the disclosed embodiments.

Each transistor 510-540, 610-640, 710-740, and 810-840 can further include a secondary gate 515-545, 615-645, 715-745, and 815-845 also referred to herein as a back gate or supplementary gate) adjacent to (e.g., below, and immediately adjacent to) an active device region opposite a primary gate 514-544, 614-644, 714-744, and 814-844, respectively. For example, each structure 500, 600A-B, 700A-B, 800A-B can include well regions within and at the top surface of semiconductor substrate 501, 601, 701, 801 immediately adjacent insulator layer 502, 602, 702, 802. For purposes of this disclosure, a well region refers to a region of semiconductor material doped (e.g., via a dopant implantation process or any other suitable doping process) so as to have a particular conductivity type. In the disclosed embodiments, the well regions can include one or more P-type well regions (Pwell) 551, 651, 751, 851 and one or more N-type well region (Nwell) 552, 652, 752, 852 laterally surrounding and adjacent to the Pwells. The well regions can further include a buried N-type well region (buried Nwell) 555, 655, 755, 855 in the semiconductor substrate 501, 601, 701, 801 below the Pwells and Nwells to provide isolation from a lower portion of the semiconductor substrate. Each secondary gate 515-545, 615-645, 715-745, and 815-845 of each transistor 510-540, 610-640, 710-740, and 810-840 will include adjacent portions of the insulator layer 502, 602, 702, 802 (which functions as a gate dielectric) and a well region below (which functions as a gate conductor).

Those skilled in the art will recognize that one advantage of fully depleted semiconductor-on-insulator (e.g., FDSOI) technology processing platforms is that N-type transistors (e.g., NFETs) and P-type transistors (PFETs) can be formed on an insulator layer above an Nwell or a Pwell in order to achieve different types of NFETs or PFETs with different threshold voltages (VTs). For example, for super low threshold voltage (SLVT) or low threshold voltage (LVT) FETs, NFETs are formed above Nwells and PFETs are formed above Pwells. For regular threshold voltage (RVT) or high threshold voltage (HVT) FETs, NFETs are formed above Pwells and PFETs are formed above Nwells. Typically, a circuit block will include all SLVT (or LVT) FETs with NFETs above Nwells and PFETs above Pwells or all RVT (or HVT) FETs with NFETs above Pwells and PFETs above Nwells. Those skilled in the art will recognize that whether the FETs are SLVT or LVT FETs or whether they are RVT or HVT FETs will depend upon the design (e.g., device size, such as shorter channel widths resulting in lower threshold voltages, etc.) and process specifications (e.g., channel doping specifications or other doping specifications, etc.).

Figure 5:
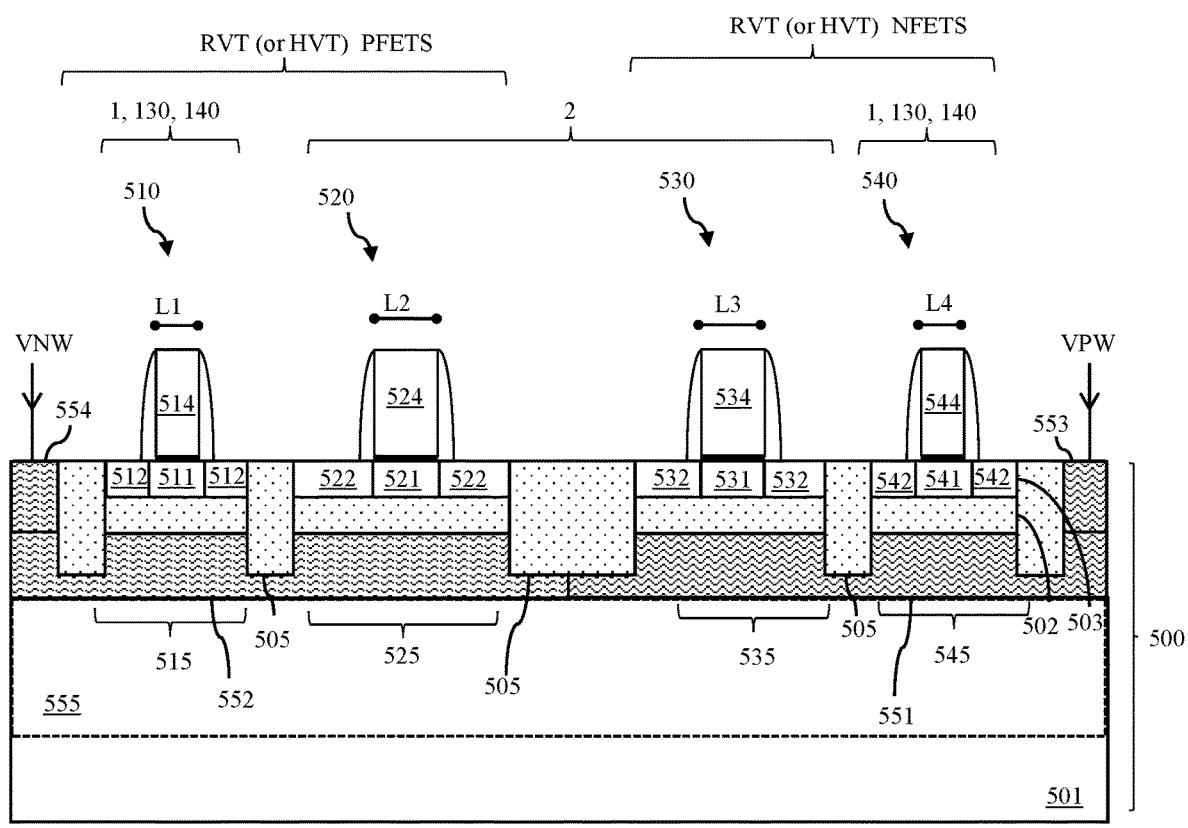
FIGS. 5, 6A-6B, 7A-7B, and 8A-8B are cross-section diagrams illustrating examples of fully-depleted semiconductor-on-insulator transistors that could be incorporated into the disclosed embodiments including variations in channel lengths and/or threshold voltages between transistors within the primary section, first transmission gate, and second transmission gate and transistors within the secondary section.

FIG. 5 specifically illustrates an embodiment where all transistors 510, 520, 530, and 540 within the primary section 1, first transmission gate 130, second transmission gate 140, and secondary section 2 are the same threshold voltage type and, in this case, RVT (or HVT) FETs because all PFETs 510, 520 are on an Nwell 552, whereas all NFETs 530, 540 are aligned above a Pwell. In this embodiment, each PFET 520 in the secondary section 2 can have a channel length (L2) greater than the channel lengths (L1) of each PFET 510 in the primary section 1, first transmission gate 130, and second transmission gate 140 and each NFET 530 in the secondary section 2 can have a channel length (L3) greater than the channel length (L4) of each NFET 540 in the primary section 1, first transmission gate 130, and second transmission gate 140.

Figure 6A:
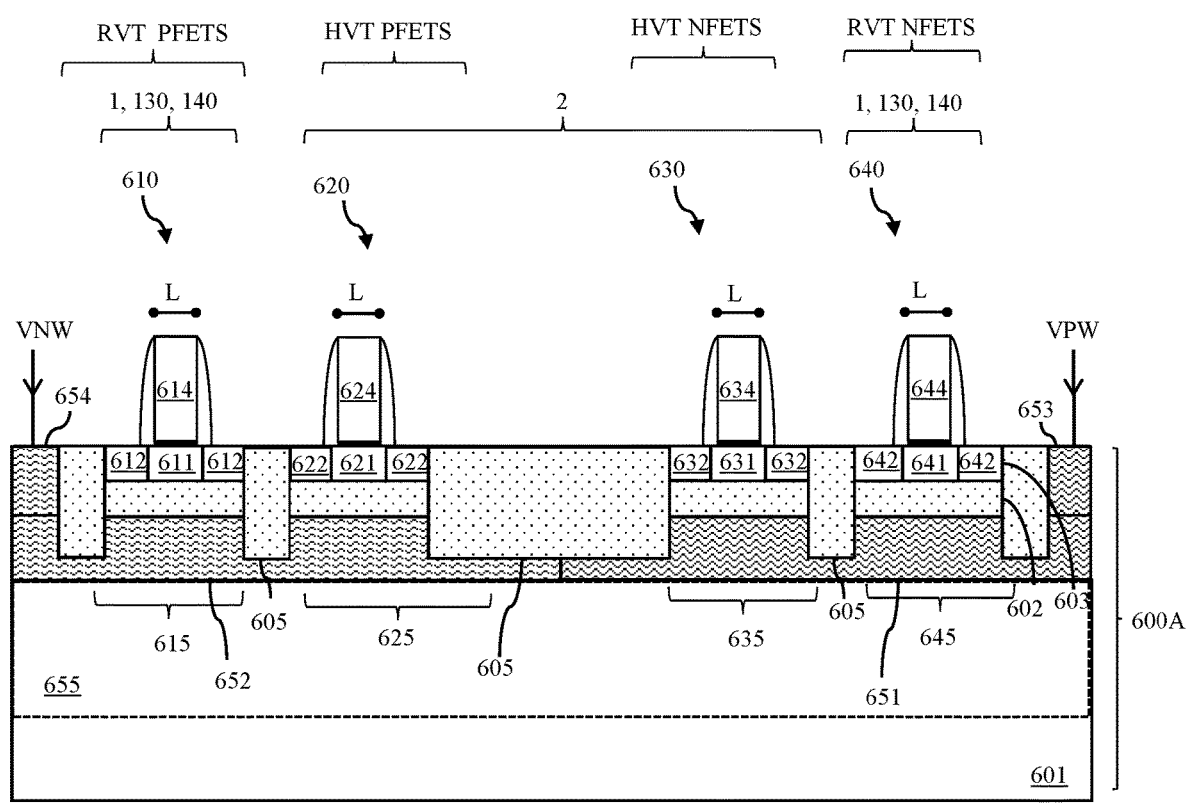
Figure 6B:
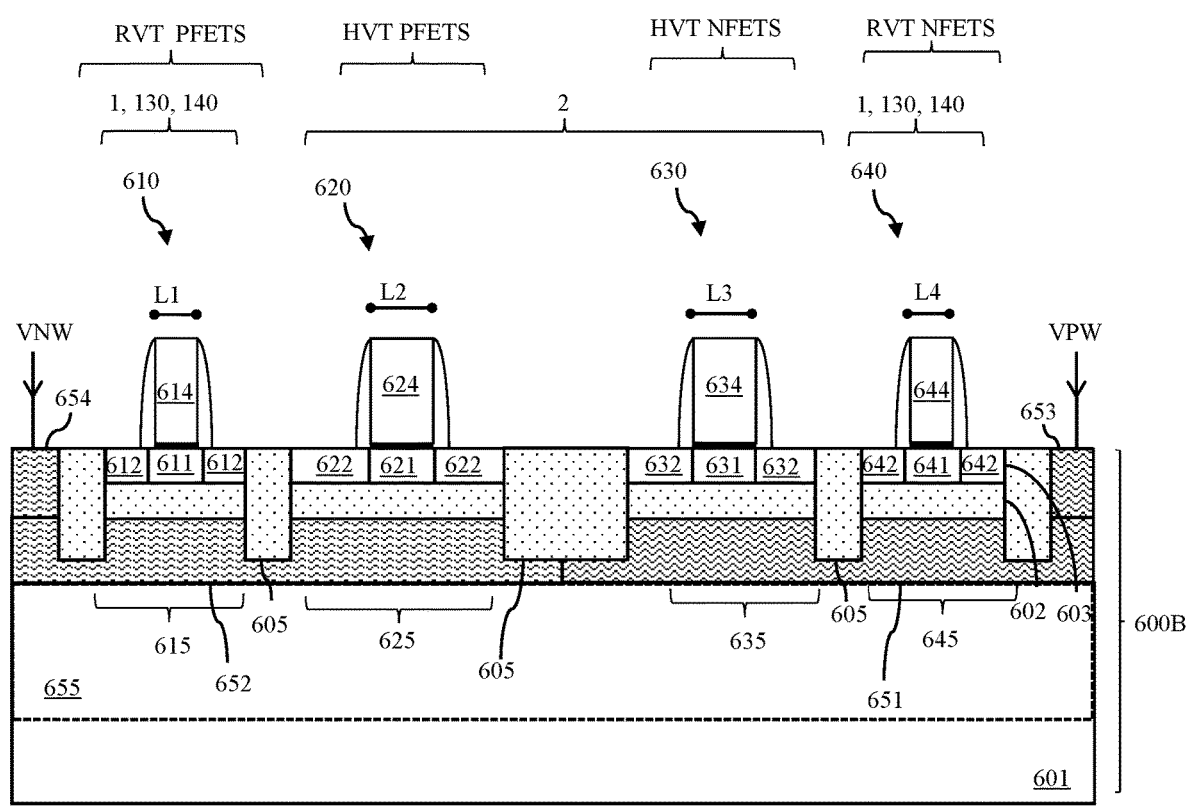

FIG. 6A specifically illustrates an embodiment where each PFET 610 and NFET 640 within primary section 1, first transmission gate 130, second transmission gate 140 has a lower threshold voltage than each PFET 620 and NFET 630 within the secondary section 2. For example, in this case, PFETs 610, 620 can be aligned above an Nwell 652 and NFETs 630, 640 can be aligned above a Pwell 651 such that they are all RVT or HVT FETs. Additionally, design specifications (e.g., channel widths, channel doping, etc.) for PFET 610 can be different from design specifications for PFET 620 so that each PFET 610 is an RVT PFET and each PFET 620 is an HVT PFET. Similarly, the design specifications (e.g., channel widths, channel doping, etc.) for NFET 640 can be different from design specifications for NFET 630 so that each NFET 640 is an RVT NFET and each NFET 630 is an HVT NFET. In this case, the channel lengths (L) of all transistors could be essentially the same, as illustrated in FIG. 6A or, as illustrated in FIG. 6B, each PFET 620 in secondary section 2 can have a channel length (L2) greater than the channel lengths (L1) of each PFET 610 in the primary section 1, first transmission gate 130, and second transmission gate 140 and each NFET 630 in secondary section 2 can have channel lengths (L3) greater than the channel lengths (L4) of each NFET 640 in the primary section 1, first transmission gate 130, and second transmission gate 140.

Figure 7A:
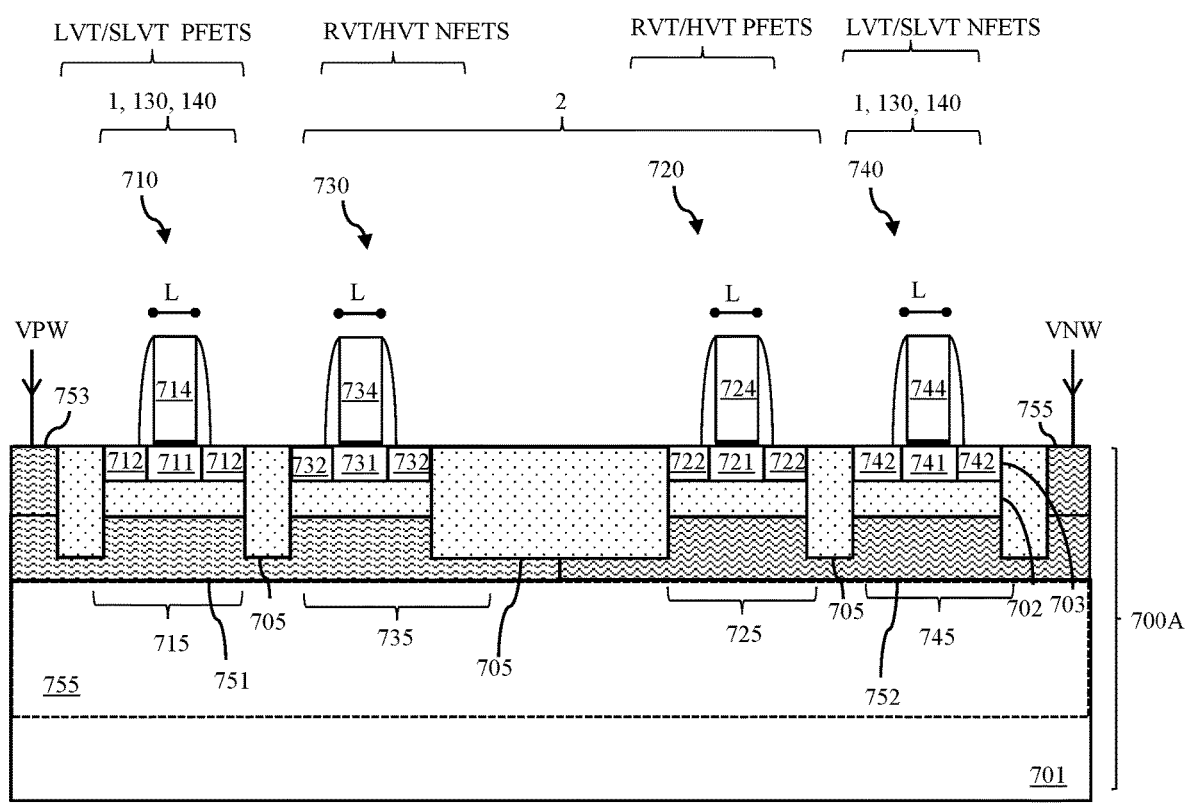
Figure 7B:
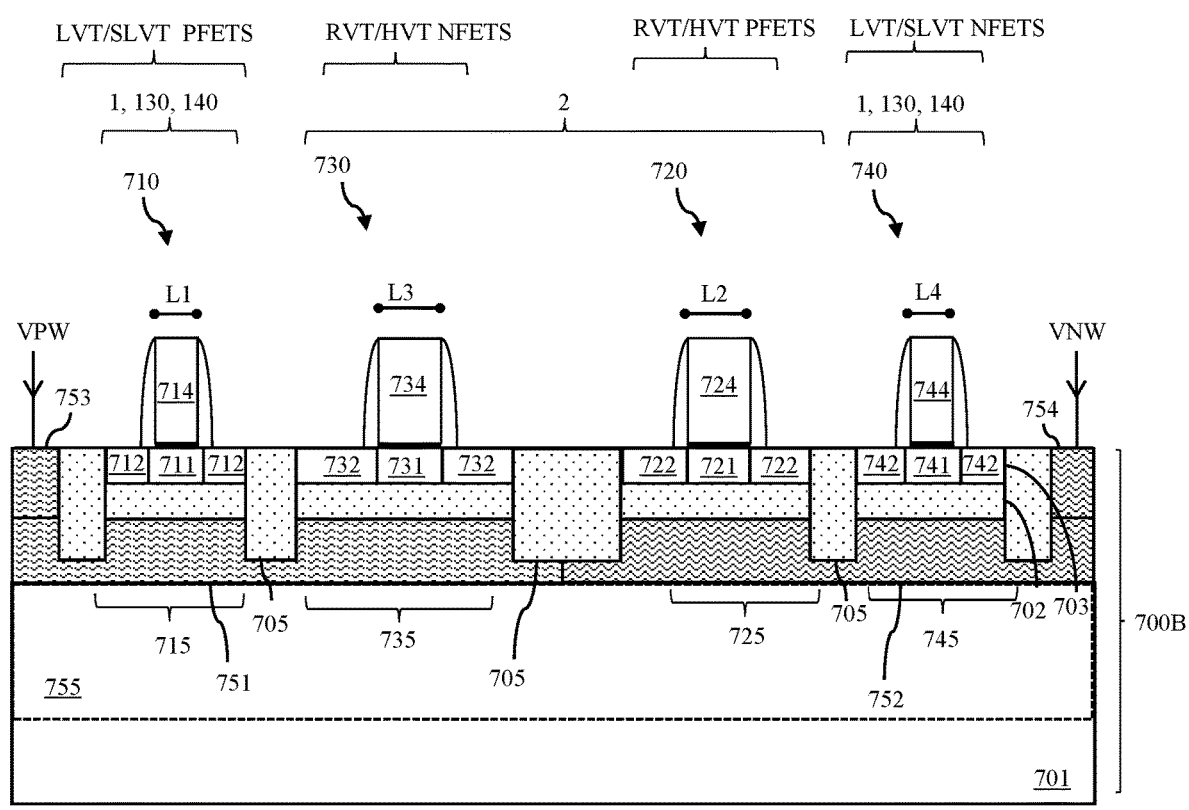

FIG. 7A illustrates another embodiment where each PFET 710 and NFET 740 within primary section 1, first transmission gate 130, second transmission gate 140 has a lower threshold voltage than each PFET 720 and NFET 730 within the secondary section 2. For example, in this case, PFETs 710, 720 can be aligned above different well regions and, particularly, a Pwell 751 and an Nwell 752, respectively, so that each PFET 710 is an LVT or SLVT PFET and each PFET 720 is an RVT or HVT PFET. Similarly, NFETs 730, 740 can be aligned above different well regions and, particularly, above Pwell 751 and Nwell 752, respectively, so that each NFET 730 is an RVT or HVT NFET and each NFET 740 is an LVT or SLVT NFET. In this case, the channel lengths (L) of all transistors could be essentially the same, as illustrated in FIG. 7A or, as illustrated in FIG. 7B, each PFET 720 in secondary section 2 can have a channel length (L2) greater than the channel lengths (L1) of each PFET 710 in the primary section 1, first transmission gate 130, and second transmission gate 140 and each NFET 730 in secondary section 2 can have channel lengths (L3) greater than the channel lengths (L4) of each NFET 740 in the primary section 1, first transmission gate 130, and second transmission gate 140.

Figure 8A:
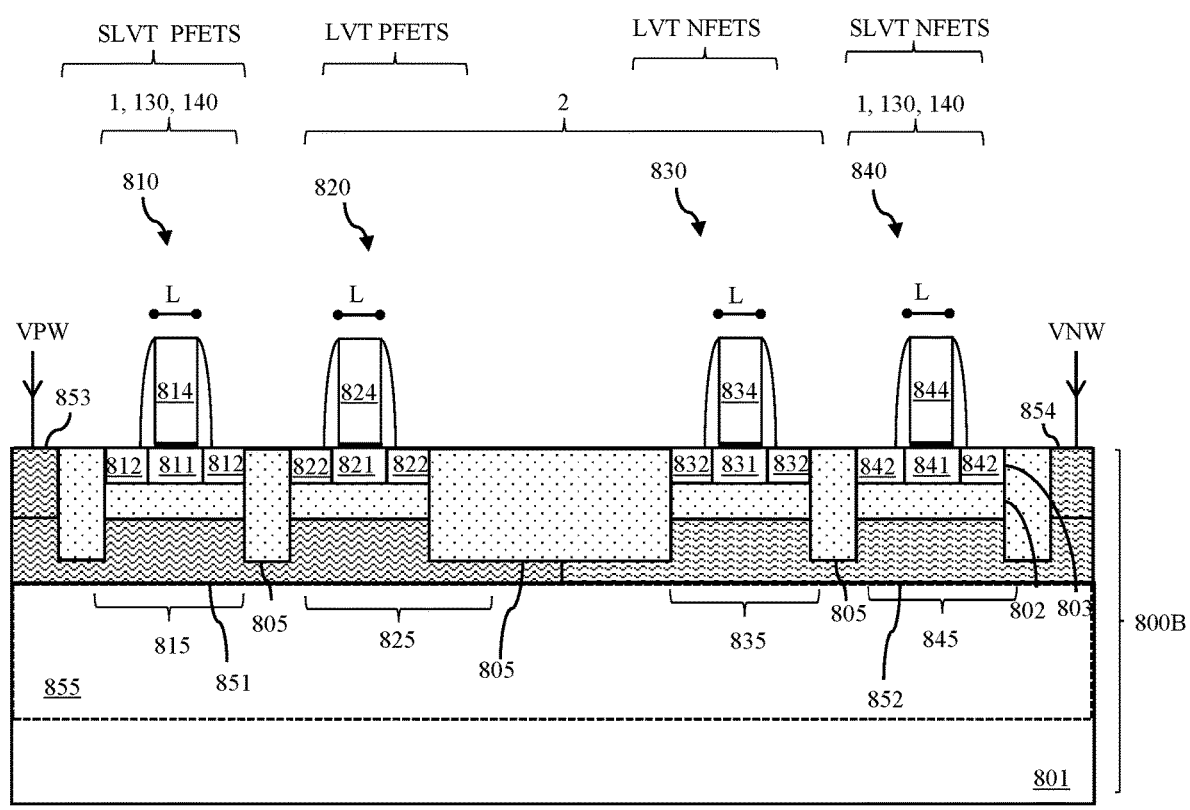
Figure 8B:
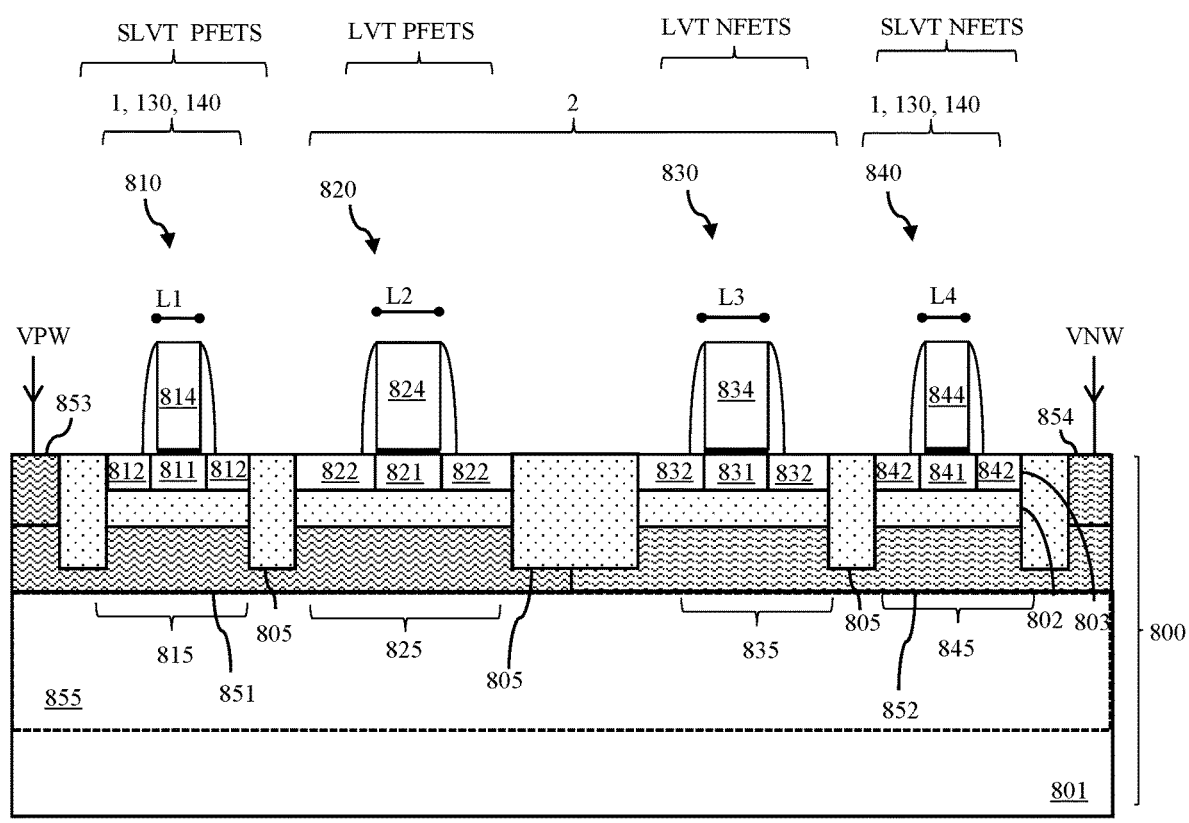

FIG. 8A specifically illustrates an embodiment where each PFET 810 and NFET 840 within primary section 1, first transmission gate 130, second transmission gate 140 has a lower threshold voltage than each PFET 820 and NFET 830 within the secondary section 2. For example, in this case, PFETs 810, 820 can be aligned above a Pwell 851 and NFETs 830, 840 can be aligned above an Nwell 852 such that they are all at least LVT or SLVT FETs. Additionally, design specifications (e.g., channel widths, channel doping, etc.) for PFET 810 can be different from design specifications for PFET 820 so that each PFET 810 is a SLVT PFET and each PFET 820 is a LVT PFET (with a higher VT than the SLVT PFET). Similarly, the design specifications (e.g., channel widths, channel doping, etc.) for NFET 840 can be different from design specifications for NFET 830 so that each NFET 840 is an SLVT NFET and each NFET 830 is an LVT NFET (with a higher VT than the SLVT NFET). In this case, the channel lengths (L) of all transistors could be essentially the same, as illustrated in FIG. 8A or, as illustrated in FIG. 8B, each PFET 820 in secondary section 2 can have a channel length (L2) greater than the channel lengths (L1) of each PFET 810 in the primary section 1, first transmission gate 130, and second transmission gate 140 and each NFET 830 in secondary section 2 can have channel lengths (L3) greater than the channel lengths (L4) of each NFET 840 in the primary section 1, first transmission gate 130, and second transmission gate 140.

Structures 500, 600A-B, 700A-B, 800A-B of FIGS. 5, 6A-6B, 7A-7B, and 8A-8B, can further include bulk regions (also referred to as hybrid regions). These regions can be devoid of the insulator layer 502, 602, 702, 802 and instead can include one or more P-type well contact regions 553, 653, 753, 853 (also referred to herein as Ptaps) on the semiconductor substrate 501, 601, 701, 801 immediately adjacent to each Pwell 551, 651, 751, 851 and one or more N-type well contact regions 554, 654, 754, 854 (also referred to herein Ntaps) on the semiconductor substrate 501, 601, 701, 801 immediately adjacent the Nwell 552, 652, 752, 852. Such taps can be electrically isolated from the active device regions of the FETs by isolation regions 505, 605, 705, 805. Such taps can include, for example, epitaxially grown monocrystalline semiconductor layers (e.g., epitaxially grown silicon layers or epitaxially grown layers of any other suitable semiconductor material) on the top surface of the semiconductor substrate. Each Ptap can be doped (e.g., in situ or subsequently implanted) so as to have the P-type conductivity, optionally at a higher conductivity level than the Pwell below. Each Ntap can be doped (e.g., in situ or subsequently implanted) so as to have the N-type conductivity, optionally at a higher conductivity level than the Nwell below. Optionally, Ptaps and/or Ntaps can further include silicide layers thereon (not shown). It should be understood that such taps can be electrically connected to vias voltage sources to enable back biasing of the various FETs included in the flip-flop 100. Those skilled in the art will recognize that in fully-depleted semiconductor-on-insulator processing technology platforms (e.g., FDSOI processing technology platforms) FETs can be either forward back biased (FBB) or reverse back biased (RBB) by applying a particular bias voltage to the well region below the FETs. FBB refers to applying a gate bias voltage to the well region to reduce the VT of the FET, thereby increasing the switching speed. For PFETs, FBB is achieved with the application of a negative bias voltage, whereas, for NFETs, FBB is achieved with the application of a positive bias voltage. RBB refers to applying a gate bias voltage to the well region below the FET to increase the VT of the FET, thereby reducing the switching speed. For PFETs, RBB is achieved with the application of a positive bias voltage, whereas, for NFETs, RBB is achieved with the application of a negative bias voltage. It should be understood that any back biasing should be performed in a manner that avoids forward biasing PN diodes formed by the various well regions within the semiconductor substrate. Techniques for forming fully-depleted semiconductor-on-insulator field effect transistors and for back biasing such transistors are known in the art and, thus, the details thereof have been omitted in order to allow the reader to focus on the salient aspects of the disclosed embodiments related to the flip-flop 100 shown in FIGS. 1-3B and operation thereof shown in the timing diagrams of FIGS. 4A-4C.

It should be understood that in the structures and method described above, a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit comprising:
    a switchable power supply;
    a primary section connected to the switchable power supply, wherein the primary section includes: a primary latch having a first input terminal and a first output terminal; and a data output device connected to the first output terminal;
    a continuous power supply;
    a secondary section connected to the continuous power supply, wherein the secondary section includes a secondary latch having a second input terminal and a second output terminal;
    a first transmission gate connected between the first output terminal and the second input terminal; and
    a second transmission gate connected between the second output terminal and the second input terminal.

2. The circuit of claim 1,
    wherein the switchable power supply switches a first power supply voltage provided to the primary section between a first positive voltage level in a first mode and zero volts in a second mode,
    wherein the continuous power supply provides a second power supply voltage at a second positive voltage level to the secondary section in the first mode and in the second mode,
    wherein, in the first mode, at least the first transmission gate is conductive, and
    wherein, in the second mode, the first transmission gate is non-conductive and the second transmission gate is conductive.

3. The circuit of claim 2, wherein the first positive voltage level and the second positive voltage level are different positive voltage levels.

4. The circuit of claim 2, wherein the first positive voltage level and the second positive voltage level are equal positive voltage levels.

5. The circuit of claim 1,
    wherein the primary section further includes a first logic block that receives a global clock signal and outputs an inverted clock signal and a local clock signal, and
    wherein the secondary section further includes a second logic block that receives a set/reset signal and outputs an inverted set/reset signal.

6. The circuit of claim 5,
    wherein the primary latch includes:
        a first tri-state logic device, a first inverter, and a second tri-state logic device connected in-series between the first input terminal and the first output terminal; and
        a feedback tri-state logic device connected to intermediate nodes on signal paths between the first inverter and the second tri-state logic device and between the first inverter and the first tri-state logic device,
    wherein each tri-state logic device in the primary latch is controlled, in part, by the local clock signal and the inverted clock signal,
    wherein the first transmission gate is controlled by the set/reset signal and the inverted set/reset signal, and
    wherein the second transmission gate is controlled by the local clock signal, the inverted clock signal, the set/reset signal and the inverted set/reset signal.

7. The circuit of claim 1, wherein the secondary latch includes a second inverter and a third inverter connected in series between the first transmission gate and the second transmission gate and wherein the third inverter is connected to the continuous power supply by an always-on P-type field effect transistor.

8. The circuit of claim 1,
wherein the primary section, the secondary section, the first transmission gate and the second transmission gate include multiple field effect transistors, and
wherein, of the multiple field effect transistors, transistors within the primary section, the first transmission gate, and the second transmission gate have shorter channel lengths than transistors within the secondary section.

9. The circuit of claim 8,
wherein the primary section, the secondary section, the first transmission gate and the second transmission gate include multiple field effect transistors, and
wherein all of the multiple field effect transistors are same threshold voltage-type transistors.

10. The circuit of claim 9, wherein the multiple field effect transistors are all regular threshold voltage-type transistors.

11. A circuit comprising:
a switchable power supply;
a primary section connected to the switchable power supply, wherein the primary section includes: a primary latch having a first input terminal and a first output terminal; and a data output device connected to the first output terminal;
a continuous power supply;
a secondary section connected to the continuous power supply, wherein the secondary section includes a secondary latch having a second input terminal and a second output terminal;
a first transmission gate connected between the first output terminal and the second input terminal; and
a second transmission gate connected between the second output terminal and the second input terminal,
wherein the primary section, the secondary section, the first transmission gate, and the second transmission gate include multiple field effect transistors, and
wherein, of the multiple field effect transistors, transistors within the primary section, the first transmission gate, and the second transmission gate have lower threshold voltages than transistors within the secondary section.

12. The circuit of claim 11,
wherein the switchable power supply switches a first power supply voltage provided to the primary section between a first positive voltage level in a first mode and zero volts in a second mode,
wherein the continuous power supply provides a second power supply voltage at a second positive voltage level to the secondary section in the first mode and in the second mode,
wherein, in the first mode, at least the first transmission gate is conductive, and
wherein, in the second mode, the first transmission gate is non-conductive and the second transmission gate is conductive.

13. The circuit of claim 12, wherein the first positive voltage level and the second positive voltage level are different positive voltage levels.

14. The circuit of claim 12, wherein the first positive voltage level and the second positive voltage level are equal positive voltage levels.

15. The circuit of claim 11,
wherein the primary section further includes a first logic block that receives a global clock signal and outputs an inverted clock signal and a local clock signal, and
wherein the secondary section further includes a second logic block that receives a set/reset signal and outputs an inverted set/reset signal.

16. The circuit of claim 15,
wherein the primary latch includes:
a first tri-state logic device, a first inverter, and a second tri-state logic device connected in-series between the first input terminal and the first output terminal; and
a feedback tri-state logic device connected to intermediate nodes on signal paths between the first inverter and the second tri-state logic device and between the first inverter and the first tri-state logic device,
wherein each tri-state logic device in the primary latch is controlled, in part, by the local clock signal and the inverted clock signal,
wherein the first transmission gate is controlled by the set/reset signal and the inverted set/reset signal,
wherein the second transmission gate is controlled by the local clock signal, the inverted clock signal, the set/reset signal and the inverted set/reset signal, and
wherein the secondary latch includes a second inverter and a third inverter connected in series between the first transmission gate and the second transmission gate and wherein the third inverter is connected to the continuous power supply by an always-on P-type field effect transistor.

17. A circuit comprising:
a switchable power supply;
a primary section connected to the switchable power supply, wherein the primary section includes: a primary latch having a first input terminal and a first output terminal; and a data output device connected to the first output terminal;
a continuous power supply;
a secondary section connected to the continuous power supply, wherein the secondary section includes a secondary latch having a second input terminal and a second output terminal;
a first transmission gate connected between the first output terminal and the second input terminal; and
a second transmission gate connected between the second output terminal and the second input terminal,
wherein the primary section, the secondary section, the first transmission gate, and the second transmission gate include multiple field effect transistors, and
wherein, of the multiple field effect transistors, transistors within the primary section, the first transmission gate, and the second transmission gate have shorter channel lengths and lower threshold voltages than transistors within the secondary section.

18. The circuit of claim 17,
wherein the switchable power supply switches a first power supply voltage provided to the primary section between a first positive voltage level in a first mode and zero volts in a second mode,
wherein the continuous power supply provides a second power supply voltage at a second positive voltage level to the secondary section in the first mode and in the second mode,
wherein, in the first mode, at least the first transmission gate is conductive, and
wherein, in the second mode, the first transmission gate is non-conductive and the second transmission gate is conductive.

19. The circuit of claim 17,
wherein the primary section further includes a first logic block that receives a global clock signal and outputs an inverted clock signal and a local clock signal, and
wherein the secondary section further includes a second logic block that receives a set/reset signal and outputs an inverted set/reset signal.

20. The circuit of claim 19,
wherein the primary latch includes:
 a first tri-state logic device, a first inverter, and a second tri-state logic device connected in-series between the first input terminal and the first output terminal; and
 a feedback tri-state logic device connected to intermediate nodes on signal paths between the first inverter and the second tri-state logic device and between the first inverter and the first tri-state logic device,
wherein each tri-state logic device in the primary latch is controlled, in part, by the local clock signal and the inverted clock signal,
wherein the first transmission gate is controlled by the set/reset signal and the inverted set/reset signal,
wherein the second transmission gate is controlled by the local clock signal, the inverted clock signal, the set/reset signal and the inverted set/reset signal, and
wherein the secondary latch includes a second inverter and a third inverter connected in series between the first transmission gate and the second transmission gate and wherein the third inverter is connected to the continuous power supply by an always-on P-type field effect transistor.

* * * * *